(12) United States Patent
Shen et al.

(10) Patent No.: US 11,658,599 B1
(45) Date of Patent: May 23, 2023

(54) VOLTAGE MEASUREMENT DEVICE FOR PULSE-WIDTH MODULATION SIGNALS, MOTOR DRIVING DEVICE AND METHOD THEREOF

(71) Applicant: Industrial Technology Research Institute, Hsinchu (TW)

(72) Inventors: Wen-Che Shen, New Taipei (TW); Cheng-Min Chang, Keelung (TW); Chun-Chieh Chang, Taipei (TW); Po-Huan Chou, Hsinchu County (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 14 days.

(21) Appl. No.: 17/548,617

(22) Filed: Dec. 13, 2021

(51) Int. Cl.
*H02P 27/08* (2006.01)
*G01R 15/04* (2006.01)
(Continued)

(52) U.S. Cl.
CPC ............. *H02P 27/08* (2013.01); *G01R 15/04* (2013.01); *G01R 19/0007* (2013.01); *H02M 7/53871* (2013.01)

(58) Field of Classification Search
CPC .... H02P 7/00; H02P 7/29; H02P 27/00; H02P 27/04; H02P 27/06; H02P 27/08;
(Continued)

(56) References Cited

U.S. PATENT DOCUMENTS 5,268,628 A 12/1993 Dong-Il
9,374,021 B2 6/2016 Tallam et al.
(Continued)

FOREIGN PATENT DOCUMENTS

CN 110932614 A 3/2020
CN 113241983 A 8/2021
(Continued)

OTHER PUBLICATIONS

Guan-Ren Chen et al., "Phase Voltage Measurement for Permanent Magnet Machine Sensorless Drive Using Controller Capture Modulator", Jan. 2020, pp. 49-58, vol. 67, No. 1, IEEE Transactions on Industrial Electronics.
(Continued)

*Primary Examiner* — Antony M Paul
(74) *Attorney, Agent, or Firm* — WPAT, P.C (57) ABSTRACT

A voltage measurement device for pulse-width modulation (PWM) signals is provided, which includes a conversion circuit and a processing circuit. The conversion circuit receives a first PWM signal and a second PWM signal from a motor driving device, and converts the first PWM signal and the second PWM signal into the absolute value signal and the polarity signal of the line-to-line voltage signal between the first PWM signal and the second PWM signal. The processing circuit converts the polarity signal and the absolute value signal into a first integral signal and a second integral signal, and reconstructs the line-to-line voltage signal according to the first integral signal and the second integral signal so as to obtain the reconstructed voltage signal of the line-to-line voltage signal.

29 Claims, 11 Drawing Sheets

(51) Int. Cl.
*G01R 19/00* (2006.01)
*H02M 7/5387* (2007.01)

(58) Field of Classification Search
CPC ...... H02P 27/085; H02P 25/00; H02P 25/022; H02P 25/062; H02P 25/064; H02P 8/10; H02P 8/18; H02P 6/00; H02P 6/005; H02P 1/00; H02P 1/24; H02P 1/26; H02P 1/46; H02P 2201/03
See application file for complete search history.

(56) References Cited

U.S. PATENT DOCUMENTS

| | | | |
|---|---|---|---|
| 10,742,146 | B2 | 8/2020 | Takada et al. |
| 10,879,825 | B2 * | 12/2020 | Chen ................ H02P 21/18 |
| 2015/0311834 | A1 | 10/2015 | Purfuerst et al. |
| 2019/0157998 | A1 | 5/2019 | Takada et al. |
| 2020/0287492 | A1 | 9/2020 | Sega |
| 2020/0313589 | A1 | 10/2020 | Chen et al. |

FOREIGN PATENT DOCUMENTS

| | | |
|---|---|---|
| EP | 2887084 A1 | 6/2015 |
| TW | 201119204 | 6/2011 |
| TW | 201509088 | 3/2015 |
| TW | 202027403 A | 7/2020 |

OTHER PUBLICATIONS

Seung-Jun Chee et al., "Dead-time compensation based on pole voltage measurement", 2015, pp. 1549-1555, IEEE.

Yukai Wang et al., "Using Volt-Second Sensing to Directly Improve Torque Accuracy and Self-Sensing at Low Speeds", SEP./Oct. 2017, pp. 4472-4482, vol. 53, No. 5, IEEE Transactions on Industry Applications.

Michael Schubert et al., "Instantaneous Phase Voltage Sensing in PWM Voltage-Source Inverters", Aug. 2018, vol. 33, No. 8, pp. 6926-6935, IEEE Transactions on Power Electronics.

Riccardo Antonello et al., "Benefits of Direct Phase Voltage Measurement in the Rotor Initial Position Detection for Permanent-Magnet Motor Drives", Nov. 2015, pp. 6719-6726, vol. 62, No. 11, IEEE Transactions on Industrial Electronics.

Kan Liu et al., "Influence of Nonideal Voltage Measurement on Parameter Estimation in Permanent-Magnet Synchronous Machines", Jun. 2012, pp. 2438-2447, vol. 59, No. 6, IEEE Transactions on Industrial Electronics.

TW OA dated Nov. 30, 2022.

* cited by examiner

VOLTAGE MEASUREMENT DEVICE FOR PULSE-WIDTH MODULATION SIGNALS, MOTOR DRIVING DEVICE AND METHOD THEREOF

TECHNICAL FIELD

The technical field relates to a voltage measurement device for pulse-width modulation signal, a motor driving device and the PWM signal voltage measurement method thereof.

BACKGROUND

Pulse-width modulation (PWM) can change the amplitudes of the output voltages by adjusting the duty cycles of power transistors, which can achieve various advantages, such as high efficiency and saving computing resources. Currently, pulse-width modulation has been comprehensively applied to various devices, such as drivers, inverters, etc., so as to control the switches (power transistors) of motors. These devices usually need to provide the protection mechanism of dead time so as to avoid that the switches of motors are damaged because of being simultaneously turned on. However, the protection mechanism of dead time tends to result in switching errors between PWM signals and commands. The aforementioned switching errors would be more serious when the switches operate in low duty cycles.

In general, it is usually to perform real-time voltage compensation by measuring feedback signals via hardware with a view to improve the aforementioned switching errors caused by dead time. However, this solution needs to execute voltage conversion via voltage-frequency conversion circuits, but the input voltages of currently available voltage-frequency conversion chips are usually low, so the application thereof is limited. Besides, currently available voltage-frequency conversion chips are expensive, which significantly increases the cost of this solution.

SUMMARY

An embodiment of the disclosure relates to a voltage measurement device for pulse-width modulation (PWM) signals is provided, which includes a conversion circuit and a processing circuit. The conversion circuit receives a first PWM signal and a second PWM signal from a motor driving device, and converts the first PWM signal and the second PWM signal into the absolute value signal and the polarity signal of the line-to-line voltage signal between the first PWM signal and the second PWM signal. The processing circuit converts the polarity signal and the absolute value signal into a first integral signal and a second integral signal, and reconstructs the line-to-line voltage signal according to the first integral signal and the second integral signal so as to obtain the reconstructed voltage signal of the line-to-line voltage signal.

Another embodiment of the disclosure relates to a motor driving device, which includes a signal generator and a PWM signal voltage measurement device. The signal generator generates a first PWM signal and a second PWM signal. The PWM voltage measurement device is connected to the signal generator, and includes a conversion circuit and a processing circuit. The conversion circuit receives the first PWM signal and the second PWM signal, and converts the first PWM signal and the second PWM signal into the absolute value signal and the polarity signal of the line-to-line voltage signal between the first PWM signal and the second PWM signal. The processing circuit converts the polarity signal and the absolute value signal into a first integral signal and a second integral signal, and reconstructs the line-to-line voltage signal according to the first integral signal and the second integral signal in order to obtain the reconstructed voltage signal of the line-to-line voltage signal.

Still another embodiment of the disclosure relates to a voltage measurement method for PWM signals, which includes the following steps: converting a first PWM signal and a second PWM signal into the absolute value signal of the line-to-line voltage signal between the first PWM signal and the second PWM signal; converting the line-to-line voltage signal into a polarity signal; converting the polarity signal and the absolute value signal into a first integral signal and a second integral signal; and reconstructing the line-to-line voltage signal according to the first integral signal and the second integral signal in order to obtain the reconstructed voltage signal of the line-to-line voltage signal.

Further scope of applicability of the present application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The disclosure will become more fully understood from the detailed description given herein below and the accompanying drawings which are given by way of illustration only, and thus are not limitative of the disclosure and wherein:

FIG. 4A~FIG. 4M are the schematic views of the signal processing process of the voltage measurement device for PWM signals in accordance with another embodiment of the disclosure.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing. It should be understood that, when it is described that an element is "coupled" or "connected" to another element, the element may be "directly coupled" or "directly connected" to the other element or "coupled" or "connected" to the other element through a third element. In contrast, it should be understood that, when it is described that an element is "directly coupled" or "directly connected" to another element, there are no intervening elements.

Figure 1:
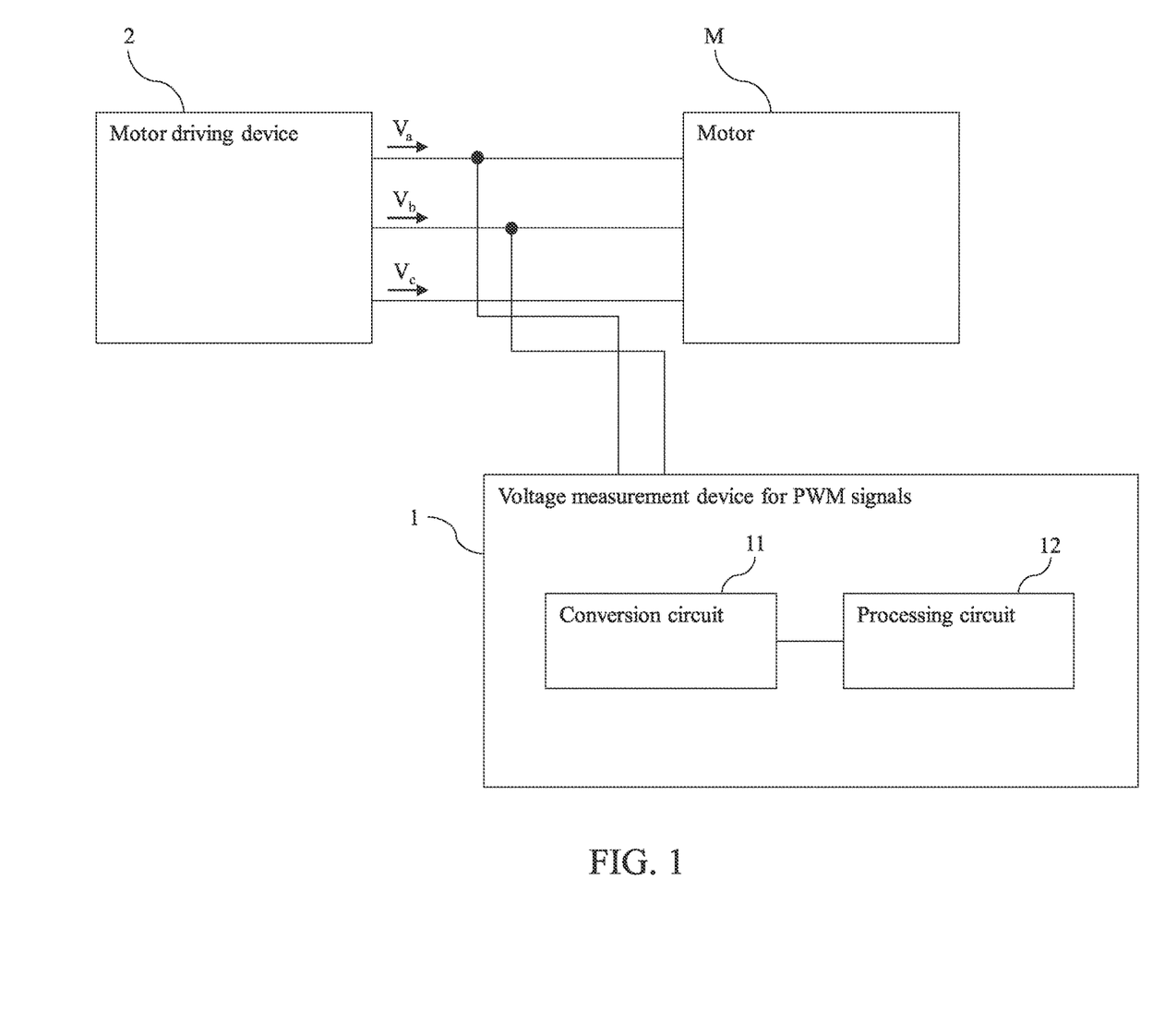
FIG. 1 is the block diagram of a voltage measurement device for pulse-width modulation (PWM) signals in accordance with one embodiment of the disclosure.

Please refer to FIG. 1, which is the block diagram of a voltage measurement device for pulse-width modulation (PWM) signals in accordance with one embodiment of the disclosure. As shown in FIG. 1, the voltage measurement device 1 for PWM signals is connected to a motor driving device 2, and includes a conversion circuit 11 and a processing circuit 12. In one embodiment, the processing circuit 12 may be a microcontroller (MCU), a central-processing unit (CPU), an application specific integrated circuit (ASIC) or other similar elements.

The motor driving device 2 generates a first PWM signal $V_a$, a second PWM signal $V_b$ and a third PWM signal $V_c$ so as to drive the motor M. In one embodiment, the motor driving device 2 may be an inverter, a driver or other similar elements.

The conversion circuit 11 is connected to the processing circuit 12. The conversion circuit 11 receives the first PWM signal $V_a$ and the second PWM signal $V_b$. Then, the conversion circuit 11 performs voltage dividing for the first PWM signal $V_a$ and the second PWM signal $V_b$ so as to generate a first voltage signal and a second voltage signal. The purpose of this step is to perform voltage reduction for the high-voltage first and second PWM signals $V_a$, $V_b$ so as to generate the first voltage signal and the second voltage signal which can be processed by the conversion circuit 11 and the processing circuit 12. Next, the conversion circuit 11 executes differential calculation to subtract the first voltage signal from the second voltage signal in order to obtain a line-to-line voltage signal. Afterward, the conversion circuit 11 executes polarity correction for the line-to-line voltage signal to obtain an absolute value signal and rectifies the line-to-line voltage signal to obtain a polarity signal including the polarity information of the line-to-line voltage signal.

The processing circuit 12 performs digital integration for the polarity signal and the absolute value signal so as to obtain a first integral signal and a second integral signal. Then, the processing circuit 12 carries out a phase reconstruction algorithm according to the first integral signal and the second integral signal so as to reconstruct the line-to-line voltage signal and obtain the reconstructed voltage signal of the line-to-line voltage signal. Finally, the processing circuit executes a line-to-phase voltage conversion algorithm according to the reconstructed voltage signal of the line-to-line voltage signal in order to reconstruct the first PWM signal $V_a$ and obtain the reconstructed voltage signal of the first PWM signal $V_a$.

Via the above mechanism, the voltage measurement device 1 for PWM signals can convert the first PWM signal $V_a$ and the second PWM signal $V_b$ into the voltage signals which can be processed by the voltage measurement device 1 via the aforementioned step of voltage dividing. Next, the voltage measurement device 1 can implement a simple digital logic computation for signal processing and signal reconstruction with a view to effectively measure the real phase voltage value of the first PWM signal $V_a$ without a voltage-frequency conversion chip. Accordingly, the application of the voltage measurement device 1 can be more comprehensive and the cost thereof can be greatly decreased.

The embodiment just exemplifies the disclosure and is not intended to limit the scope of the disclosure. Any equivalent modification and variation according to the spirit of the disclosure is to be also included within the scope of the following claims and their equivalents.

Figure 2:
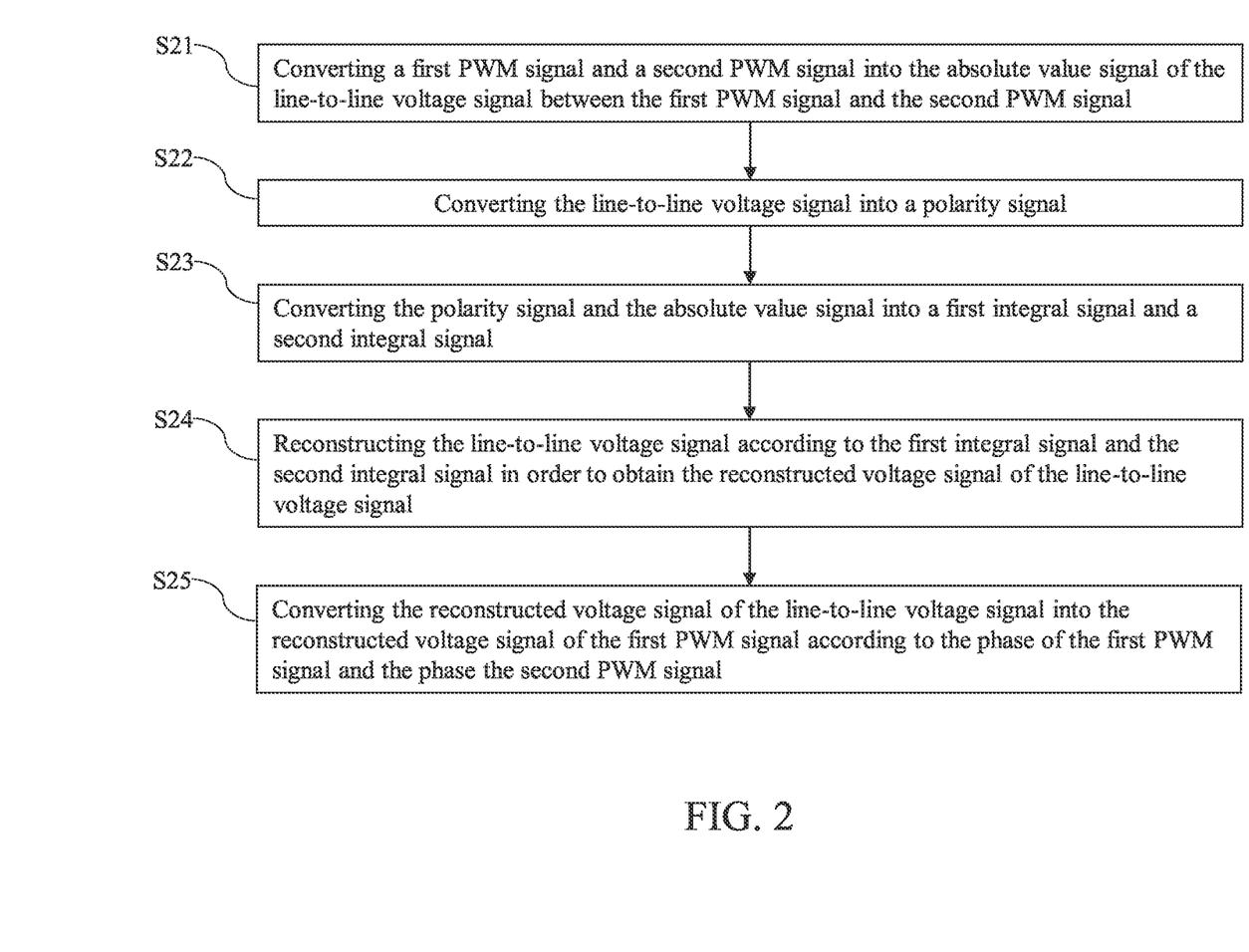
FIG. 2 is the flow chart of a voltage measurement method for PWM signals in accordance with one embodiment of the disclosure.

Please refer to FIG. 2, which is the flow chart of a voltage measurement method for PWM signals in accordance with one embodiment of the disclosure. As shown in FIG. 2, the voltage measurement method for PWM signals according to this embodiment includes the following steps:

Step S21: converting a first PWM signal and a second PWM signal into the absolute value signal of the line-to-line voltage signal between the first PWM signal and the second PWM signal.

Step S22: converting the line-to-line voltage signal into a polarity signal.

Step S23: converting the polarity signal and the absolute value signal into a first integral signal and a second integral signal.

Step S24: reconstructing the line-to-line voltage signal according to the first integral signal and the second integral signal in order to obtain the reconstructed voltage signal of the line-to-line voltage signal.

Step S25: converting the reconstructed voltage signal of the line-to-line voltage signal into the reconstructed voltage signal of the first PWM signal according to the phase of the first PWM signal and the phase the second PWM signal.

Figure 3:
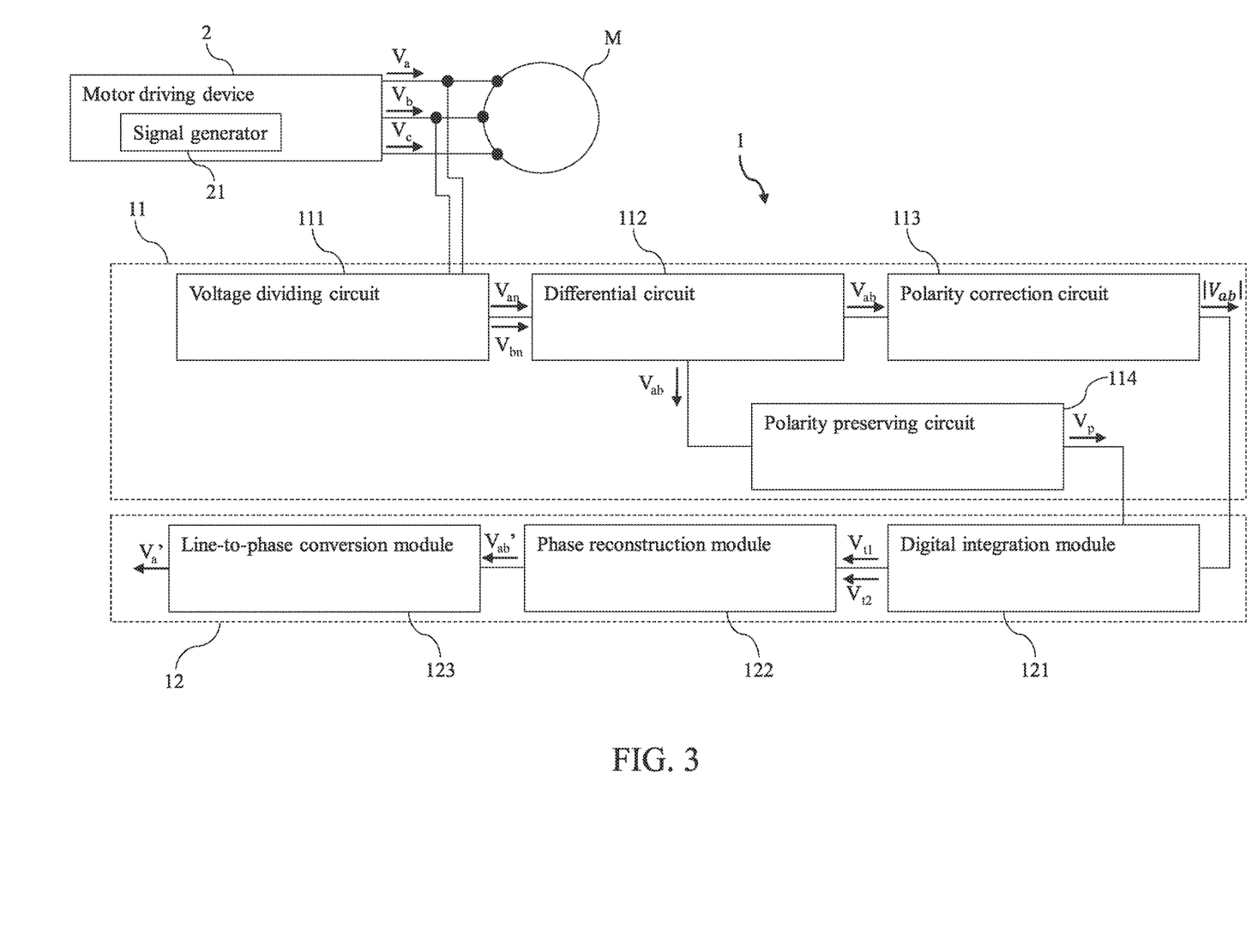
FIG. 3 is the circuit diagram of a voltage measurement device for PWM signals in accordance with another embodiment of the disclosure.

Please refer to FIG. 3 and FIG. 4A~FIG. 4M. FIG. 3 is the circuit diagram of a voltage measurement device for PWM signals in accordance with another embodiment of the disclosure. FIG. 4A~FIG. 4M are the schematic views of the signal processing process of the voltage measurement device for PWM signals in accordance with another embodiment of the disclosure. FIG. 3 illustrates one of circuit designs of the voltage measurement device 1 for PWM signals. As shown in FIG. 3, the voltage measurement device 1 is connected to a motor driving device 2 and includes a conversion circuit 11 and a processing circuit 12.

The motor driving device 2 includes a signal generator 21. The signal generator 21 generates a first PWM signal $V_a$, a second PWM signal $V_b$ and a third PWM signal $V_c$ so as to drive the motor M. In this embodiment, the motor driving device 2 may be a three-phase driving device, such as a three-phase driver, a three-phase inverter, etc.

Figure 4A:
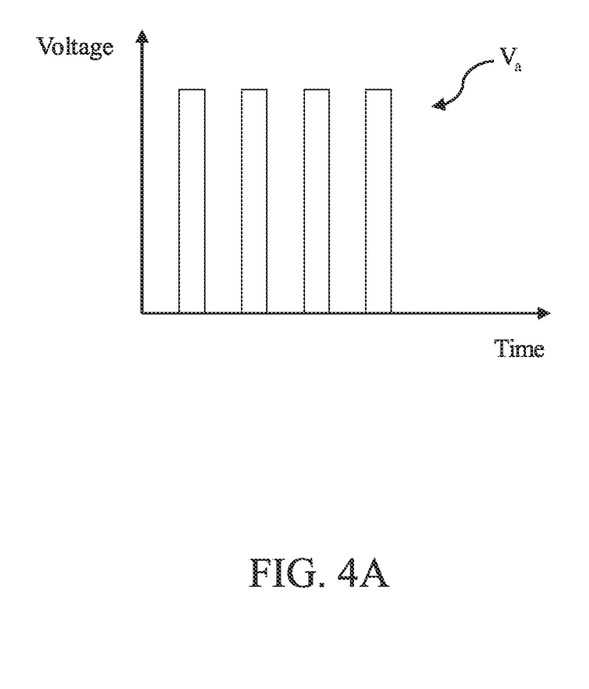
Figure 4B:
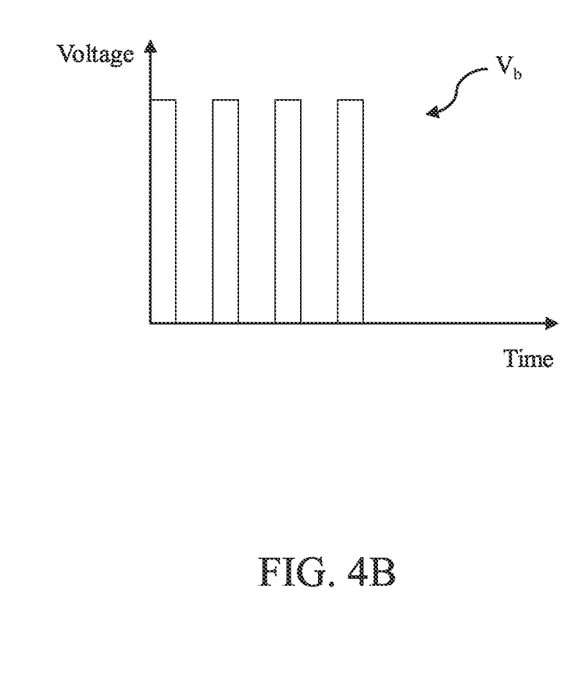
Figure 4C:
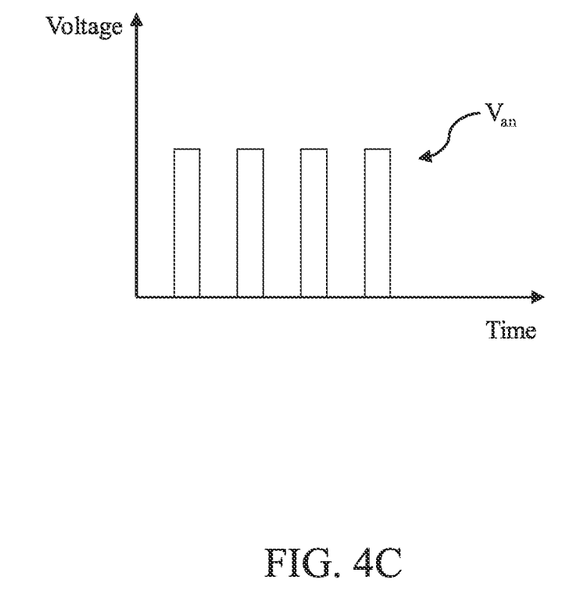
Figure 4D:
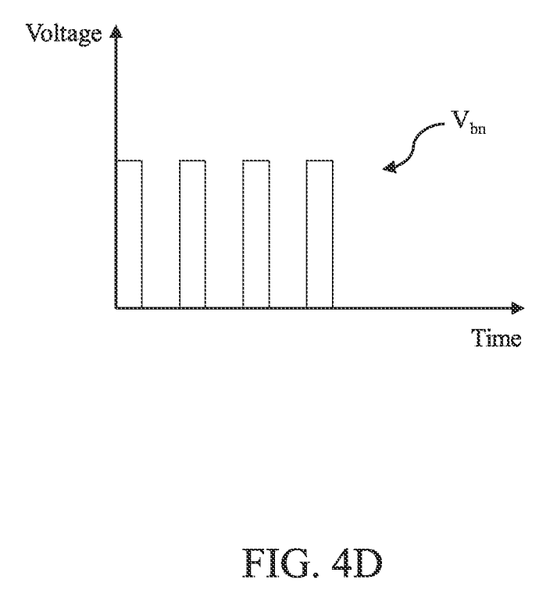

The conversion circuit 11 is connected to the processing circuit 12. The conversion circuit 11 includes a voltage dividing circuit 111, a differential circuit 112, a polarity correction circuit 113 and a polarity preserving circuit 114. The voltage dividing circuit 111 is connected to the differential circuit 112. The differential circuit 112 is connected to the polarity correction circuit 113 and the polarity preserving circuit 114. The voltage dividing circuit 111 receives the first PWM signal $V_a$ (as shown in FIG. 4A) and the second PWM signal $V_b$ (as shown in FIG. 4B), and executes voltage dividing for the first PWM signal $V_a$ and the second PWM signal $V_b$ so as to a first voltage signal $V_{an}$ (as shown in FIG. 4C) and a second voltage signal $V_{bn}$ (as shown in FIG. 4D). The purpose of this step is to perform voltage reduction for the high-voltage first and second PWM signals $V_a$, $V_b$ in order to generate the first voltage signal $V_{an}$ and the second voltage signal $V_{bn}$ which can be processed by the conversion circuit 11 and the processing circuit 12. In one embodiment, the voltage dividing circuit 111 may be a voltage divider or other similar circuits.

Figure 4E:
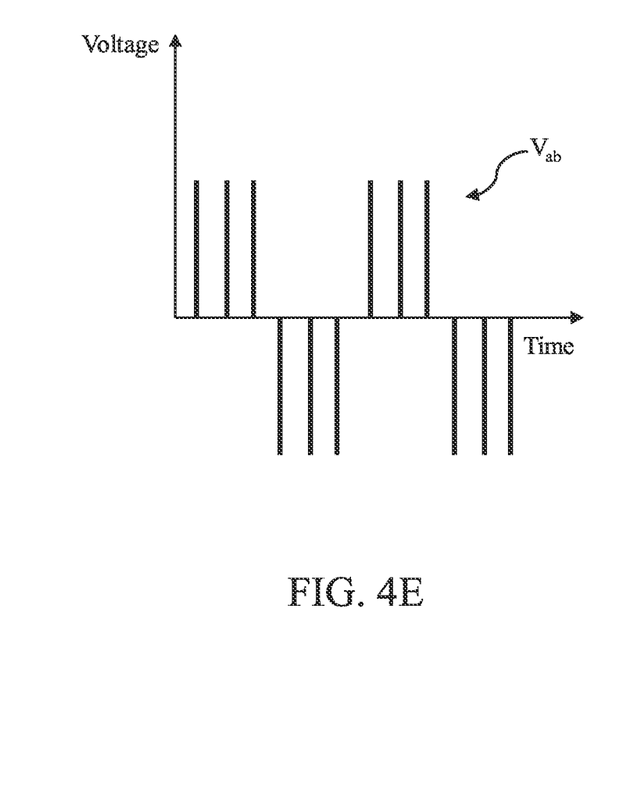

Then, the differential circuit 112 carries out differential calculation to subtract the first voltage signal $V_{an}$ from the second voltage signal $V_{bn}$ to obtain a line-to-line voltage signal $V_{ab}$ (as shown in FIG. 4E).

Figure 4F:
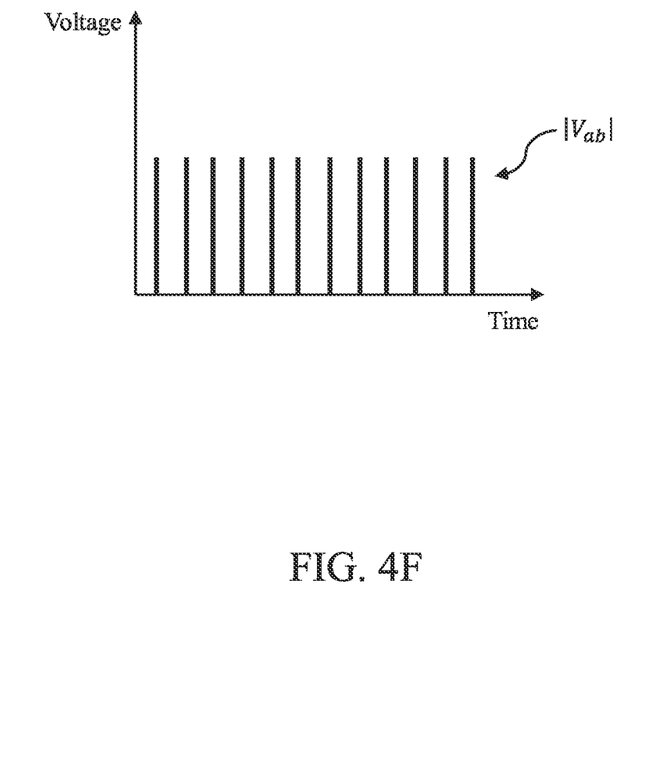
Figure 4G:
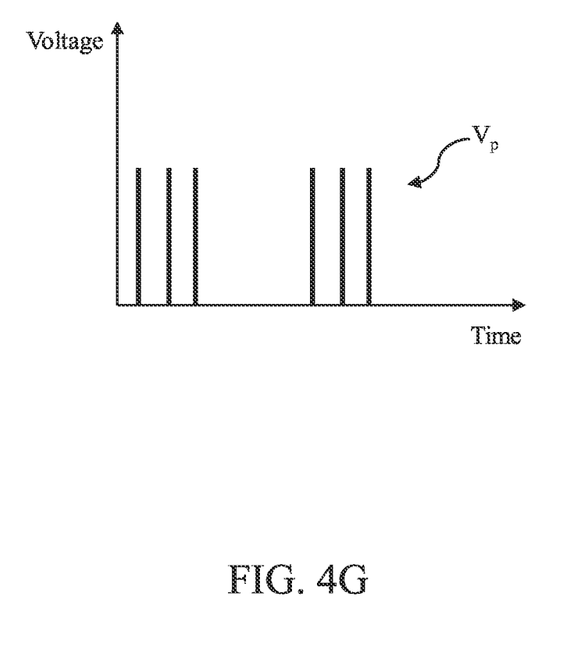

Next, since the processing circuit 12 can process only positive voltages, the polarity correction circuit 113 performs polarity correction for the line-to-line voltage signal $V_{ab}$ simultaneously including positive voltage and negative voltage so as to obtain an absolute value signal $|V_{ab}|$ including only positive voltage (as shown in FIG. 4F). In addition, the polarity preserving circuit 114 rectifies the line-to-line voltage signal $V_{ab}$ to obtain a polarity signal $V_p$ (as shown in FIG. 4G) with a view to retain the polarity information of the line-to-line voltage signal $V_{ab}$. The polarity correction circuit 113 may include several resistors and operational amplifiers. The circuit structure of the polarity correction circuit 113 has been known by those skilled in the art, so the details of the circuit structure will not be described therein. In one embodiment, the polarity preserving circuit 114 may be a diode or other similar elements. Afterward, the polarity correction circuit 113 and the polarity preserving circuit 114 can transmit the above digital signals to the processing circuit 12.

Figure 4H:
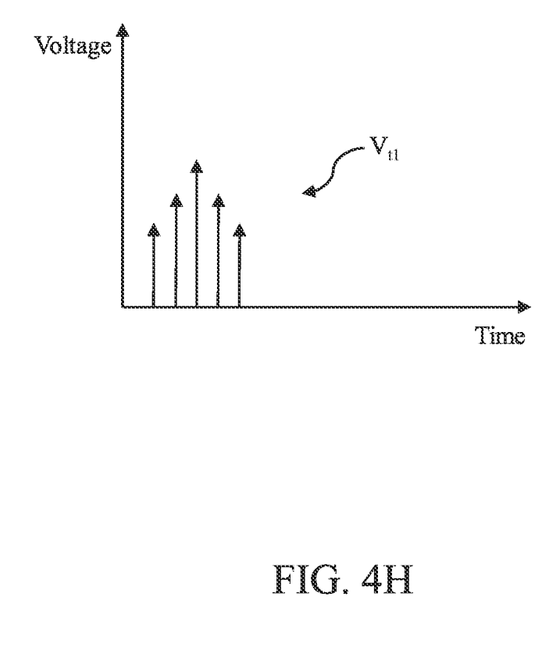
Figure 4I:
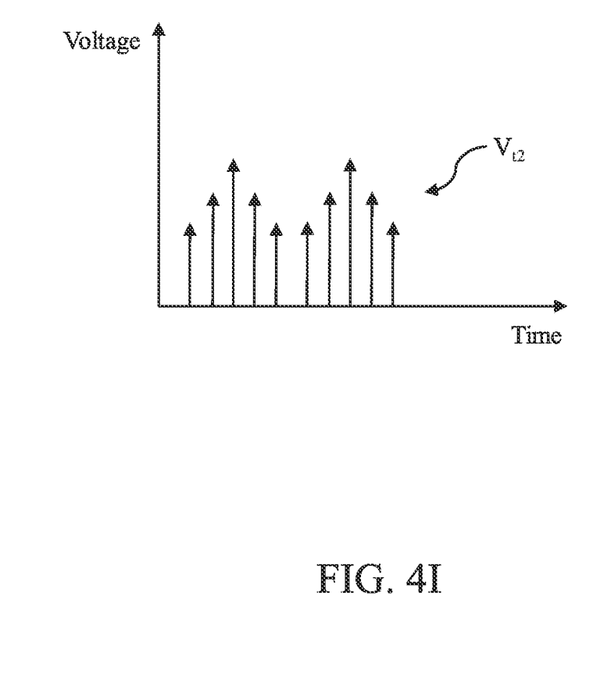

The processing circuit 12 includes a digital integration module 121, a phase reconstruction module 122 and a line-to-line conversion module 123. The digital integration module 121 is connected to the phase reconstruction module 122 and the phase reconstruction module 122 is connected to the line-to-phase conversion module 123. The digital integration module 121 receives the polarity signal $V_p$ and the absolute value signal $|V_{ab}|$, and performs digital integration for the polarity signal $V_p$ and the absolute value signal $|V_{ab}|$ so as to obtain a first integral signal $V_{t1}$ (as shown in FIG. 4H) and a second integral signal $V_{t2}$ (as shown in FIG. 4I).

Figure 4J:
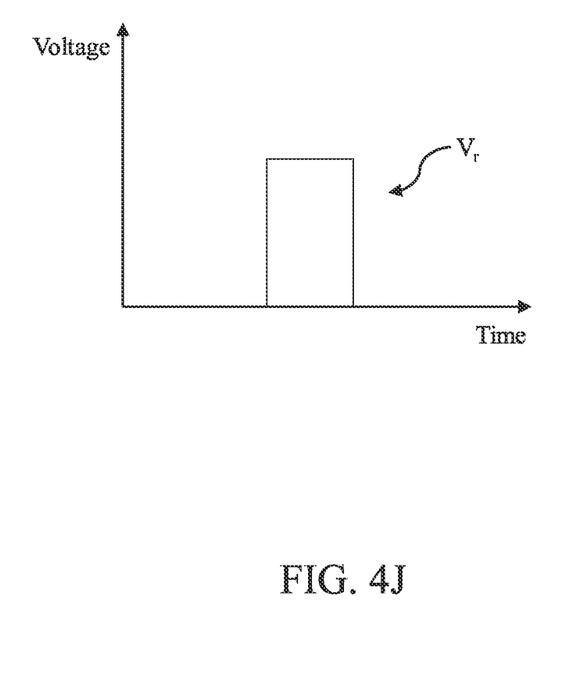
Figure 4K:
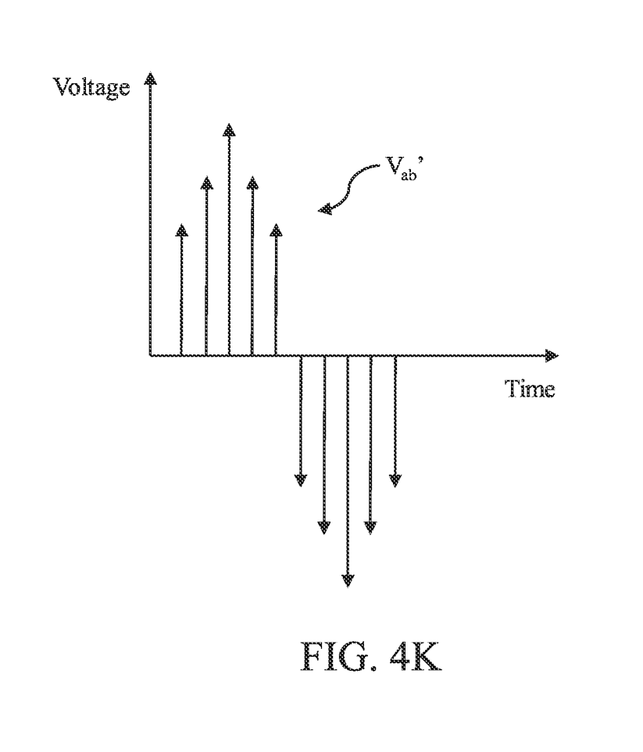

As the absolute value signal $|V_{ab}|$ has been processed by polarity correction via the polarity correction circuit 113, so the absolute value signal $|V_{ab}|$ needs to be further processed by signal reconstruction via the polarity signal $V_p$ having the polarity information of the line-to-line voltage signal $V_{ab}$. In this step, the phase reconstruction module 122 reverses the first integral signal $V_{t1}$ via comparators and logic gates to obtain a reversed signal $V_r$ (as shown in FIG. 4J). Then, the phase reconstruction module 122 further reverses the second integral signal $V_{t2}$ according to the reversed signal $V_r$ in order to reconstruct the line-to-line voltage signal $V_{ab}$. Via the above phase reconstruction algorithm, the phase reconstruction module 122 can reconstructs the line-to-line voltage signal $V_{ab}$ according to the first integral signal Vu and the second integral signal $V_{t2}$ so that the reconstructed voltage signal $V_{ab}'$ (as shown in FIG. 4K) of the line-to-line voltage signal $V_{ab}$ can be obtained.

Figure 4L:
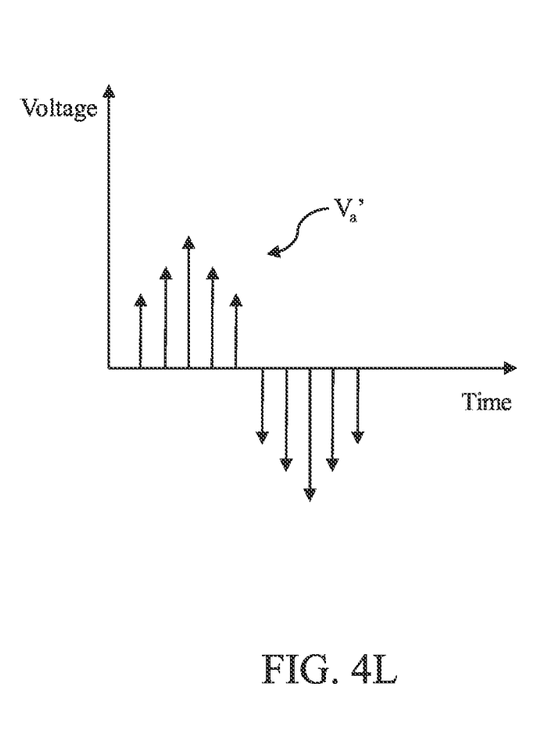
Figure 4M:
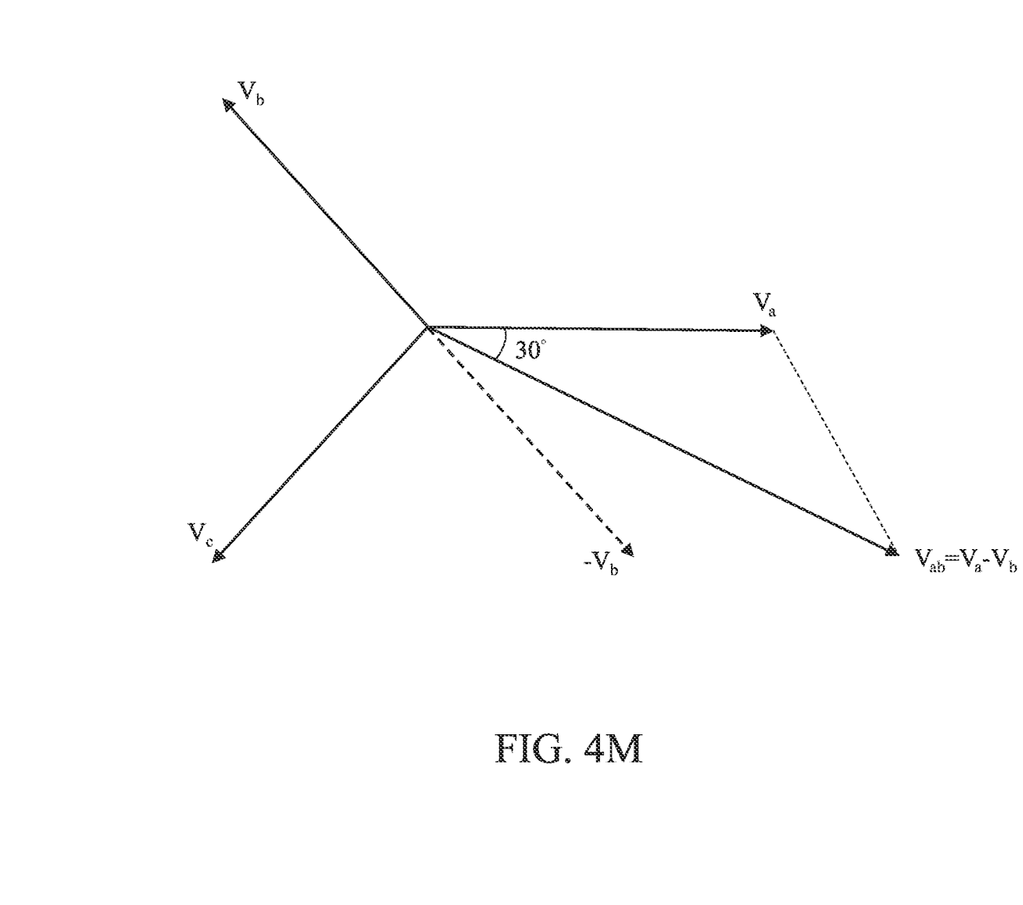

Finally, the line-to-phase conversion module 123 executes a line-to-phase conversion algorithm according to the reconstructed voltage signal $V_{ab}'$ to reconstruct the first PWM signal $V_a$ so as to obtain the reconstructed voltage signal $V_a'$ of the first PWM signal $V_a$ (as shown in FIG. 4L). In this way, the real phase voltage value of the first PWM signal $V_a$ can be obtained. The line-to-phase voltage conversion algorithm can be performed according to the phase relation between the first PWM signal $V_a$, the second PWM signal $V_b$ and the third PWM signal $V_c$, as shown in FIG. 4M. Therefore, the conversion relation between these signals can be expressed by Equations (1)~(3) given below:

$$|V_a|=|V_{ab}|/\sqrt{3}; \angle V_a = \angle V_{ab}+30° \quad (1)$$

$$|V_b|=|V_{bc}|/\sqrt{3}; \angle V_b = \angle V_{bc}+30° \quad (2)$$

$$|V_c|=|V_{ca}|/\sqrt{3}; \angle V_c = \angle V_{ca}+30° \quad (3)$$

The aforementioned line-to-phase voltage conversion algorithm has been known by those skilled in the art, so the details of the algorithm will not be described therein.

In this case, the reconstructed voltage signal $V_a'$ of the first PWM signal $V_a$ can be feedback to the motor driving device 2 by the voltage measurement device 1. Accordingly, the motor driving device 2 can make real-time voltage command compensation with a view to improve the switching errors caused by dead time or for other applications.

In another embodiment, the voltage measurement device 1 can be directly integrated with the motor driving device 2, such that the voltage measurement device 1 serves as one of the functional circuits of the motor driving device 2. Thus, the motor driving device 2 can make real-time voltage command compensation in order to improve the switching errors caused by dead time or for other applications.

If it is necessary to further reduce the errors of the system, the voltage measurement device 1 can execute the above calculation mechanism according to the second PWM signal $V_b$ and the third PWM signal $V_c$ (and the third PWM signal $V_c$ and the first PWM signal $V_a$) so as to obtain the reconstructed voltage signal of the second PWM signal $V_b$ (and the reconstructed voltage signal of the third PWM signal $V_c$). Besides, if the motor driving device 2 is a two-phase driving device, only the reconstructed voltage signal of the line-to-line voltage signal $V_{ab}$ needs to be obtained and the following line-to-phase conversion can be omitted.

The embodiment just exemplifies the disclosure and is not intended to limit the scope of the disclosure. Any equivalent modification and variation according to the spirit of the disclosure is to be also included within the scope of the following claims and their equivalents.

It is worthy to point out that the input voltages of currently available voltage-frequency conversion chips are usually low, so the application thereof is limited. Besides, currently available voltage-frequency conversion chips are expensive, which significantly increase the cost. On the contrary, according to one embodiment of the disclosure, the voltage measurement device for PWM signals can convert high-voltage PWM signals into digital signals via a low-cost digital logic circuit for signal processing and signal reconstruction. Thus, the application of the voltage measurement device can be more comprehensive and the cost thereof can be also significantly reduced.

Besides, according to one embodiment of the disclosure, the measurement bandwidth of the voltage measurement device for PWM signals is subject to the operational amplifiers of the functional circuits thereof, which can make sure that the measurement bandwidth is always enough for PWM signal measurement.

Further, according to one embodiment of the disclosure, the voltage measurement device for PWM signals can measure high-voltage PWM signals in real time via a voltage dividing circuit. In addition, the voltage measurement device can perform a simple and effective digital signal processing process via a polarity correction circuit, a differential circuit and a processing circuit. As a result, the voltage measurement device not only saves a large amount of computing resources, but also enhances the measurement precision thereof.

Moreover, according to one embodiment of the disclosure, the voltage measurement device for PWM signals can perform digital integration for the output signals of a conversion circuit via the processing circuit and then execute the following digital signal processing. Accordingly, the voltage measurement device can effectively improve the measurement resolution thereof with a view to provide excellent measurement performance.

Furthermore, the voltage measurement device for PWM signals is applicable to various motor driving devices, such as single-phase drivers/inverters, two-phase drivers/inverters, three-phase drivers/inverters, etc. Therefore, the voltage measurement device can satisfy actual needs of various applications. As described above, the voltage measurement device for PWM signals according to the embodiments of the disclosure can certainly achieve great technical effects.

Figure 5:
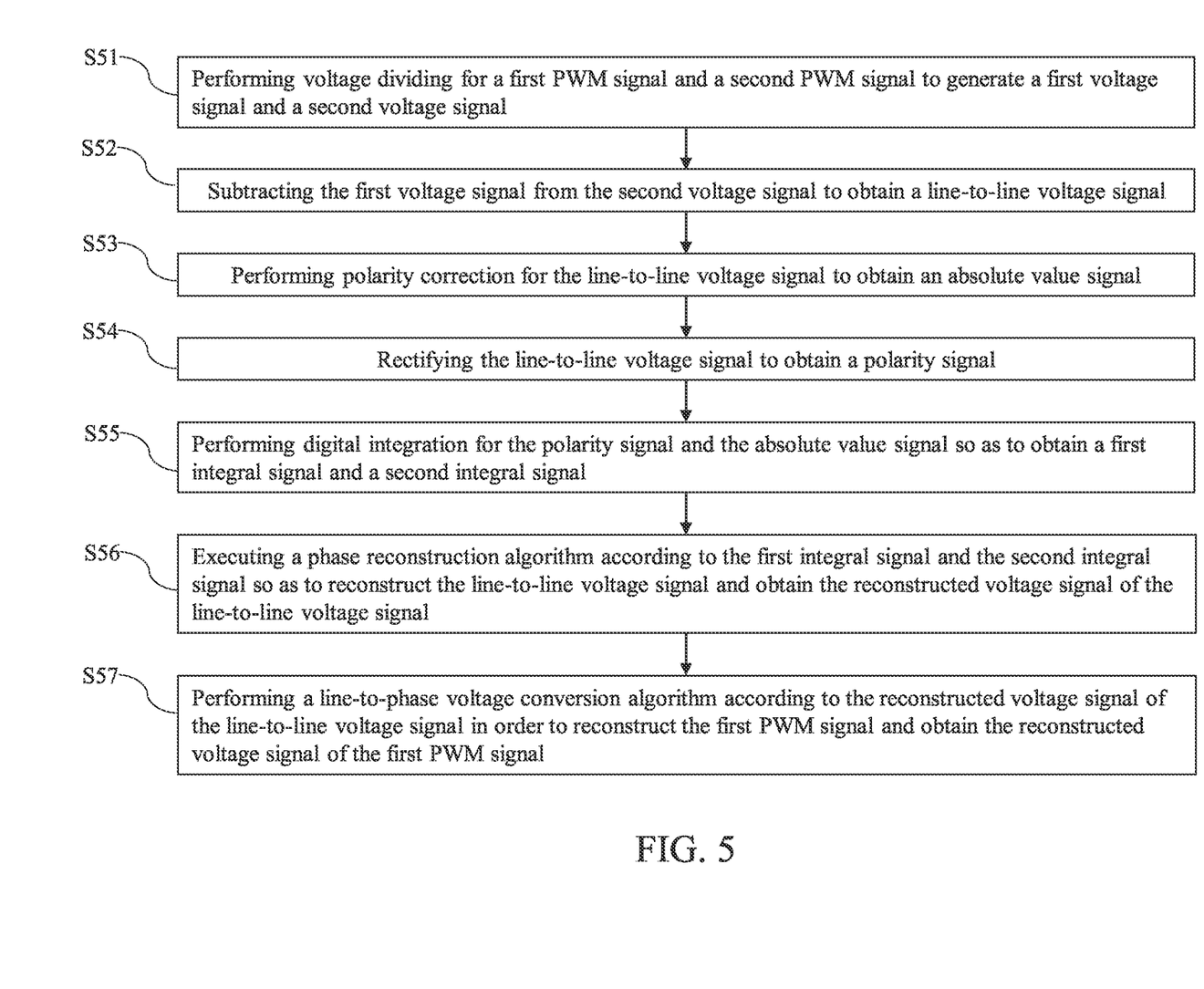
FIG. 5 is the flow chart of a voltage measurement method for PWM signals in accordance with another embodiment of the disclosure.

Please refer to FIG. 5, which is the flow chart of a voltage measurement method for PWM signals in accordance with another embodiment of the disclosure. As shown in FIG. 5, the voltage measurement method for PWM signals according to this embodiment includes the following steps:

Step S51: performing voltage dividing for a first PWM signal and a second PWM signal to generate a first voltage signal and a second voltage signal. This step performs voltage reduction for the high-voltage first and second PWM signals to generate the low-voltage first and second voltage signals.

Step S52: subtracting the first voltage signal from the second voltage signal to obtain a line-to-line voltage signal. This step performs differential calculation to subtract the first voltage signal from the second voltage signal with a view to obtain the line-to-line voltage signal.

Step S53: performing polarity correction for the line-to-line voltage signal to obtain an absolute value signal. This step executes polarity correction to convert the line-to-line voltage signal $V_{ab}$ including both positive voltage and negative voltage into the absolute value signal having only positive voltage.

Step S54: rectifying the line-to-line voltage signal to obtain a polarity signal. This step rectifies the line-to-line voltage signal to obtain the polarity signal in order to retain the polarity information of the line-to-line voltage signal.

Step S55: performing digital integration for the polarity signal and the absolute value signal so as to obtain a first integral signal and a second integral signal. This step performs digital integration for the polarity signal and the absolute value signal via the functional module inside the processing circuit, such as a digital integrator, so as to obtain the first integral signal and the second integral signal.

Step S56: executing a phase reconstruction algorithm according to the first integral signal and the second integral signal so as to reconstruct the line-to-line voltage signal and obtain the reconstructed voltage signal of the line-to-line voltage signal. This step reverses the first integral signal via the corresponding functional circuit to obtain the reversed signal and then reverses the second integral signal according to the reversed signal in order to reconstruct the line-to-line voltage signal.

Step S57: performing a line-to-phase voltage conversion algorithm according to the reconstructed voltage signal of the line-to-line voltage signal in order to reconstruct the first PWM signal and obtain the reconstructed voltage signal of the first PWM signal. This step executes the line-to-phase voltage conversion algorithm according to the phase relation between the first PWM signal, the second PWM signal and the third PWM signal in order to obtain the reconstructed voltage signal of the first PWM signal.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

Alternatively, the elements of the embodiments of the disclosure (such as the conversion circuit 11, the functional circuits of the conversion circuit 11, the processing circuit 12, the functional circuits of the processing circuit 12 and the signal generator 21) may be implemented entirely in hardware, entirely in software or in an implementation containing both hardware and software elements. In embodiments which use software, the software may include, but not limited to, firmware, resident software, microcode, one or more instructions, etc.

To sum up, according to one embodiment of the disclosure, the voltage measurement device for PWM signals can convert high-voltage PWM signals into digital signals via a low-cost digital logic circuit for signal processing and signal reconstruction. Thus, the application of the voltage measurement device can be more comprehensive and the cost thereof can be also significantly reduced.

Besides, according to one embodiment of the disclosure, the measurement bandwidth of the voltage measurement device for PWM signals is subject to the operational amplifiers of the functional circuits thereof, which can make sure that the measurement bandwidth is always enough for PWM signal measurement.

Further, according to one embodiment of the disclosure, the voltage measurement device for PWM signals can measure high-voltage PWM signals in real time via a voltage dividing circuit. In addition, the voltage measurement device can perform a simple and effective digital signal processing process via a polarity correction circuit, a differential circuit and a processing circuit. As a result, the voltage measurement device not only saves a large amount of computing resources, but also enhances the measurement precision thereof.

Moreover, according to one embodiment of the disclosure, the voltage measurement device for PWM signals can perform digital integration for the output signals of a conversion circuit via the processing circuit and then execute the following digital signal processing. Accordingly, the voltage measurement device can effectively improve the measurement resolution thereof with a view to provide excellent measurement performance.

Furthermore, the voltage measurement device for PWM signals is applicable to various motor driving devices, such as single-phase drivers/inverters, two-phase drivers/inverters, three-phase drivers/inverters, etc. Therefore, the voltage measurement device can satisfy actual needs of various applications.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A voltage measurement device for pulse-width modulation (PWM) signals, comprising:
a conversion circuit, configured to receive a first PWM signal and a second PWM signal from a motor driving device, and convert the first PWM signal and the second PWM signal into an absolute value signal and a polarity signal of a line-to-line voltage signal between the first PWM signal and the second PWM signal; and
a processing circuit, configured to convert the polarity signal and the absolute value signal into a first integral signal and a second integral signal, and reconstruct the line-to-line voltage signal according to the first integral signal and the second integral signal in order to obtain a reconstructed voltage signal of the line-to-line voltage signal.

2. The voltage measurement device for PWM signals of claim 1, wherein the conversion circuit comprises a voltage dividing circuit and a differential circuit, wherein the voltage dividing circuit is configured to perform voltage dividing for the first PWM signal and the second PWM signal to generate a first voltage signal and a second voltage signal, and the differential circuit is configured to subtract the first voltage signal from the second voltage signal in order to obtain the line-to-line voltage signal.

3. The voltage measurement device for PWM signals of claim 2, wherein the voltage dividing circuit is a voltage divider.

4. The voltage measurement device for PWM signals of claim 2, wherein the conversion circuit further comprises a polarity correction circuit configured to perform polarity correction for the line-to-line voltage signal so as to obtain the absolute value signal.

5. The voltage measurement device for PWM signals of claim 4, wherein the conversion circuit further comprises a polarity preserving circuit configured to rectify the line-to-line voltage signal in order to obtain the polarity signal.

6. The voltage measurement device for PWM signals of claim 5, wherein the polarity preserving circuit comprises a diode.

7. The voltage measurement device for PWM signals of claim 1, wherein the processing circuit comprises a digital integration module configured to perform digital integration for the polarity signal and the absolute value signal so as to obtain the first integral signal and the second integral signal.

8. The voltage measurement device for PWM signals of claim 7, wherein the processing circuit further comprises a phase reconstruction module configured to execute a phase reconstruction algorithm according to the first integral signal and the second integral signal so as to reconstruct the line-to-line voltage signal and obtain the reconstructed voltage signal of the line-to-line voltage signal.

9. The voltage measurement device for PWM signals of claim 1, wherein the processing circuit converts the reconstructed voltage signal of the line-to-line voltage signal into a reconstructed voltage signal of the first PWM signal according to a phase of the first PWM signal and a phase of the second PWM signal.

10. The voltage measurement device for PWM signals of claim 9, wherein the processing circuit comprises a line-to-phase conversion module configured to perform a line-to-phase voltage conversion algorithm according to the reconstructed voltage signal of the line-to-line voltage signal in order to reconstruct the first PWM signal and obtain the reconstructed voltage signal of the first PWM signal.

11. The voltage measurement device for PWM signals of claim 1, wherein the motor driving device is a driver or an inverter.

12. A motor driving device, comprising:
a signal generator, configured to generate a first PWM signal and a second PWM signal; and
a PWM voltage measurement device, connected to the signal generator, and comprising a conversion circuit and a processing circuit;
wherein the conversion circuit is configured to receive the first PWM signal and the second PWM signal, and convert the first PWM signal and the second PWM signal into an absolute value signal and a polarity signal of a line-to-line voltage signal between the first PWM signal and the second PWM signal, wherein the processing circuit is configured to convert the polarity signal and the absolute value signal into a first integral signal and a second integral signal, and reconstruct the line-to-line voltage signal according to the first integral signal and the second integral signal in order to obtain a reconstructed voltage signal of the line-to-line voltage signal.

13. The motor driving device of claim 12, wherein the conversion circuit comprises a voltage dividing circuit and a differential circuit, wherein the voltage dividing circuit is configured to perform voltage dividing for the first PWM signal and the second PWM signal to generate a first voltage signal and a second voltage signal, and the differential circuit is configured to subtract the first voltage signal from the second voltage signal in order to obtain the line-to-line voltage signal.

14. The motor driving device of claim 13, wherein the voltage dividing circuit is a voltage divider.

15. The motor driving device of claim 13, wherein the conversion circuit further comprises a polarity correction circuit configured to perform polarity correction for the line-to-line voltage signal so as to obtain the absolute value signal.

16. The motor driving device of claim 15, wherein the conversion circuit further comprises a polarity preserving circuit configured to rectify the line-to-line voltage signal in order to obtain the polarity signal.

17. The motor driving device of claim 16, wherein the polarity preserving circuit comprises a diode.

18. The motor driving device of claim 12, wherein the processing circuit comprises a digital integration module configured to perform digital integration for the polarity signal and the absolute value signal so as to obtain the first integral signal and the second integral signal.

19. The motor driving device of claim 18, wherein the processing circuit further comprises a phase reconstruction module configured to execute a phase reconstruction algorithm according to the first integral signal and the second integral signal so as to reconstruct the line-to-line voltage signal and obtain the reconstructed voltage signal of the line-to-line voltage signal.

20. The motor driving device of claim 12, wherein the processing circuit converts the reconstructed voltage signal of the line-to-line voltage signal into a reconstructed voltage signal of the first PWM signal according to a phase of the first PWM signal and a phase of the second PWM signal.

21. The motor driving device of claim 20, wherein the processing circuit comprises a line-to-phase conversion module configured to perform a line-to-phase voltage conversion algorithm according to the reconstructed voltage signal of the line-to-line voltage signal in order to reconstruct the first PWM signal and obtain the reconstructed voltage signal of the first PWM signal.

22. The motor driving device of claim 12, wherein the motor driving device is a driver or an inverter.

23. A voltage measurement method for PWM signals, comprising:
converting a first PWM signal and a second PWM signal into an absolute value signal of a line-to-line voltage signal between the first PWM signal and the second PWM signal;
converting the line-to-line voltage signal into a polarity signal;
converting the polarity signal and the absolute value signal into a first integral signal and a second integral signal; and reconstructing the line-to-line voltage signal according to the first integral signal and the second integral signal in order to obtain a reconstructed voltage signal of the line-to-line voltage signal.

24. The voltage measurement method for PWM signals of claim 23, wherein a step of converting the first PWM signal and the second PWM signal into the absolute value signal of the line-to-line voltage signal between the first PWM signal and the second PWM signal further comprising:
performing voltage dividing for the first PWM signal and the second PWM signal to generate a first voltage signal and a second voltage signal;
subtracting the first voltage signal from the second voltage signal to obtain the line-to-line voltage signal; and
performing polarity correction for the line-to-line voltage signal to obtain the absolute value signal.

25. The voltage measurement method for PWM signals of claim 23, wherein a step of converting the line-to-line voltage signal into the polarity signal further comprising:
rectifying the line-to-line voltage signal to obtain the polarity signal.

26. The voltage measurement method for PWM signals of claim 23, wherein a step of converting the polarity signal and the absolute value signal into the first integral signal and the second integral signal further comprising:
performing digital integration for the polarity signal and the absolute value signal so as to obtain the first integral signal and the second integral signal.

27. The voltage measurement method for PWM signals of claim 26, wherein a step of reconstructing the line-to-line voltage signal according to the first integral signal and the second integral signal in order to obtain the reconstructed voltage signal of the line-to-line voltage signal further comprising:
executing a phase reconstruction algorithm according to the first integral signal and the second integral signal so as to reconstruct the line-to-line voltage signal and obtain the reconstructed voltage signal of the line-to-line voltage signal.

28. The voltage measurement method for PWM signals of claim 23, further comprising:
converting the reconstructed voltage signal of the line-to-line voltage signal into a reconstructed voltage signal of the first PWM signal according to a phase of the first PWM signal and a phase the second PWM signal.

29. The voltage measurement method for PWM signals of claim 28, wherein a step of converting the reconstructed voltage signal of the line-to-line voltage signal into the reconstructed voltage signal of the first PWM signal according to the phase of the first PWM signal and the phase the second PWM signal further comprising:
performing a line-to-phase voltage conversion algorithm according to the reconstructed voltage signal of the line-to-line voltage signal in order to reconstruct the first PWM signal and obtain the reconstructed voltage signal of the first PWM signal.

\* \* \* \* \*